United States Patent
Brew et al.

(10) Patent No.: US 12,229,652 B2
(45) Date of Patent: Feb. 18, 2025

(54) TWO-TERMINAL METASTABLE MIXED-CONDUCTOR MEMRISTIVE DEVICES

(71) Applicant: INTERNATIONAL BUSINESS MACHINES CORPORATION, Armonk, NY (US)

(72) Inventors: Kevin W. Brew, Niskayuna, NY (US); Talia S. Gershon, White Plains, NY (US); Seyoung Kim, Pohang (KR); Jerry D. Tersoff, Rockland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1004 days.

(21) Appl. No.: 17/208,370

(22) Filed: Mar. 22, 2021

(65) Prior Publication Data
US 2021/0209445 A1 Jul. 8, 2021

Related U.S. Application Data

(62) Division of application No. 15/605,185, filed on May 25, 2017, now Pat. No. 11,003,981.

(51) Int. Cl.
| | |
|---|---|
| *G11C 13/00* | (2006.01) |
| *G06N 3/04* | (2023.01) |
| *G06N 3/065* | (2023.01) |
| *G06N 3/084* | (2023.01) |
| *G11C 11/54* | (2006.01) |
| *H10N 70/00* | (2023.01) |
| *H10N 70/20* | (2023.01) |

(52) U.S. Cl.
CPC ............. *G06N 3/04* (2013.01); *G06N 3/065* (2023.01); *G06N 3/084* (2013.01); *G11C 11/54* (2013.01); *G11C 13/0007* (2013.01); *G11C 13/004* (2013.01); *G11C 13/0069* (2013.01); *H10N 70/20* (2023.02); *H10N 70/826* (2023.02); *H10N 70/8836* (2023.02); *G11C 2013/0076* (2013.01); *G11C 2013/009* (2013.01); *G11C 2013/0092* (2013.01); *G11C 2213/51* (2013.01)

(58) Field of Classification Search
CPC ... G11C 11/54; G11C 13/0007; G11C 13/004; G11C 13/0069; G11C 2013/009
See application file for complete search history.

(56) References Cited

U.S. PATENT DOCUMENTS

| | | |
|---|---|---|
| 8,415,652 B2 | 4/2013 | Yang et al. |
| 8,466,445 B2 | 6/2013 | Campbell et al. |

(Continued)

OTHER PUBLICATIONS

List of IBM Patents or Patent Applications Treated as Related dated Mar. 22, 2021, 2 pages.

(Continued)

*Primary Examiner* — Mushfique Siddique
(74) *Attorney, Agent, or Firm* — Tutunjian & Bitetto, P.C.; Robert Richard Aragona

(57) ABSTRACT

Methods for setting a resistance include applying a voltage across a memristive device, that exceeds a threshold based on a difference in chemical potential between a first material and a second material, to change a resistance of the memristive device. The memristive device includes a barrier layer of the second material that is formed between two metastable layers of the first material.

18 Claims, 7 Drawing Sheets

(56) References Cited

U.S. PATENT DOCUMENTS

| | | | |
|---|---|---|---|
| 8,872,153 B2 | 10/2014 | Yang et al. | |
| 8,891,284 B2 | 11/2014 | Williams et al. | |
| 9,118,006 B1 | 8/2015 | Campbell | |
| 10,083,974 B1* | 9/2018 | Huang | H10N 70/245 |
| 2011/0248381 A1* | 10/2011 | Tong | H10N 70/881 |
| | | | 257/E29.325 |
| 2011/0309321 A1* | 12/2011 | Yang | H10N 70/026 |
| | | | 257/E21.328 |
| 2012/0113706 A1* | 5/2012 | Williams | H10N 70/24 |
| | | | 257/E21.645 |
| 2012/0280224 A1 | 11/2012 | Doolittle et al. | |
| 2012/0319074 A1* | 12/2012 | Fujii | H10N 70/24 |
| | | | 257/4 |
| 2014/0030593 A1* | 1/2014 | Kim | H01M 4/137 |
| | | | 526/263 |
| 2018/0260684 A1* | 9/2018 | de Souza | G06N 3/065 |
| 2018/0358553 A1* | 12/2018 | Brew | H10N 70/8416 |

OTHER PUBLICATIONS

Burns, J.C. et al., "Introducing Symmetric Li-Ion Cells as a Tool to Study Cell Degradation Mechanisms" Journal of The Electrochemical Society (Nov. 2011) pp. A1417-A1422, vol. 158, No. 12.

Fuller, E.J. et al., "Scanning Probe Characterization of Memristors Based on a Li Intercalation Metal Oxide" 229th ECS Meeting (May-Jun. 2016) San Diego, CA, Abstract 1159.

Fuller, E.J. et al., "Li-Ion Synaptic Transistor for Low Power Analog Computing" Advance Material (Jan. 2017) pp. 1-8, vol. 29.

Greenlee, J.D. et al., "In-situ oxygen x-ray absorption spectroscopy investigation of the resistance modulation mechanism in $LiNbO_2$ memristors" Applied Physics Letters (May 2012) pp. 182106-1-182106-4, vol. 100.

Khatun, F. et al., "Impact of Lithium Composition on Structural, Electronic and Optical Properties of Lithium Cobaltite Prepared by Solid-state Reaction" Journal of Scientific Research (Apr. 2014) pp. 217-231, vol. 6, No. 2.

Li, D. et al., "Two-phase transition of Li-intercalation compounds in Li-ion batteries" Materials Today (Nov. 2014) pp. 451-463, vol. 17, No. 9.

Mai, V.H. et al., "Memristive and neuromorphic behavior in a $Li_xCoO_2$ nanobattery" Scientific Reports (Jan. 2015) pp. 1-6, vol. 5, No. 7761.

Oblea, A.S. et al., "Silver Chalcogenide Based Memristor Devices" IEEE The 2010 International Joint Conference on Neural Networks (IJCNN) (Oct. 2010) pp. 1-4.

Tsai, P-C, et al., "Atomistic Structure and Ab Initio Electrochemical Properties of $Li_4Ti_5O_{12}$ Defect Spinel for Li Ion Batteries" Journal of The Electrochemical Society (Jan. 2014) pp. A439-A444, vol. 161, No. 3.

Van Der Ven, A. et al., "Understanding Li Diffusion in Li-Intercalation Compounds" Account of Chemical Research (May 2013) pp. 1216-1225, vol. 46, No. 5.

Young, D. et al., "Electronic Conductivity in the Li 4/3 Ti 5/3 O 4—Li 7/3 Ti 5/3 O 4 System and Variation with State-of-Charge as a Li Battery Anode" Advanced Energy Materials (Apr. 2013) pp. 1125-1129, vol. 3.

* cited by examiner

TWO-TERMINAL METASTABLE MIXED-CONDUCTOR MEMRISTIVE DEVICES

BACKGROUND

Technical Field

The present invention generally relates to memristive devices and, more particularly, to memristive devices that use the movement of ions across a barrier to change a resistance state.

Description of the Related Art

An artificial neural network (ANN) is an information processing system that is inspired by biological nervous systems, such as the brain. The key element of ANNs is the structure of the information processing system, which includes a large number of highly interconnected processing elements (called "neurons") working in parallel to solve specific problems. ANNs are furthermore trained in-use, with learning that involves adjustments to weights that exist between the neurons. An ANN is configured for a specific application, such as pattern recognition or data classification, through such a learning process.

Referring now to FIG. 1, a generalized diagram of a neural network is shown. ANNs demonstrate an ability to derive meaning from complicated or imprecise data and can be used to extract patterns and detect trends that are too complex to be detected by humans or other computer-based systems. The structure of a neural network is known generally to have input neurons 102 that provide information to one or more "hidden" neurons 104. Connections 108 between the input neurons 102 and hidden neurons 104 are weighted and these weighted inputs are then processed by the hidden neurons 104 according to some function in the hidden neurons 104, with weighted connections 108 between the layers. There may be any number of layers of hidden neurons 104, and as well as neurons that perform different functions. There exist different neural network structures as well, such as convolutional neural network, maxout network, etc. Finally, a set of output neurons 106 accepts and processes weighted input from the last set of hidden neurons 104.

This represents a "feed-forward" computation, where information propagates from input neurons 102 to the output neurons 106. Upon completion of a feed-forward computation, the output is compared to a desired output available from training data. The error relative to the training data is then processed in "feed-back" computation, where the hidden neurons 104 and input neurons 102 receive information regarding the error propagating backward from the output neurons 106. Once the backward error propagation has been completed, weight updates are performed, with the weighted connections 108 being updated to account for the received error. This represents just one variety of ANN.

The formation of weighted connections 108 can be implemented using hardware devices, including memristive devices. One important characteristic of such devices is symmetric modulation. However, existing memristive devices are based on the formation and breaking of a conductive filament and therefore exhibit strongly asymmetric behavior.

SUMMARY

A method for setting a resistance includes applying a voltage across a memristive device that exceeds a threshold based on a difference in chemical potential between a first material and a second material to change a resistance of the memristive device. The memristive device includes a barrier layer of the second material that is formed between two metastable layers of the first material.

A method for setting a resistance includes applying a voltage across a memristive device, that exceeds a threshold based on a difference in chemical potential between a first material that comprises $Li_xCoO_2$, where x represents a lithium ion concentration, and a second material that comprises $Li_4Ti_5O_{12}$, to change a resistance of the memristive device. The memristive device includes a barrier layer of the second material that is formed between two metastable layers of the first material. Positive and negative voltages that exceed the threshold are cycled. The cycling of positive and negative voltages is halted responsive to a determination that the symmetric response has stabilized.

A method for setting a resistance includes applying a voltage across a memristive device, that exceeds a threshold based on a difference in chemical potential between a first material and a second material, to change a resistance of the memristive device. The memristive device includes a barrier layer of the second material that is formed between two metastable layers of the first material. Positive and negative voltages that exceed the threshold are cycled. The cycling of positive and negative voltages is halted responsive to a determination that the symmetric response has stabilized.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide memristive devices for, e.g., neural network applications that exhibit analog modulation, a threshold voltage for writing, bidirectional and symmetric modulation, and non-volatility. To accomplish this, a three-layer structure is used where two layers of a metastable material are formed around a barrier layer. The metastable materials may include a high mobility intercalated ion such as lithium. The barrier layer has a relatively high chemical potential for the ion but is otherwise a conductor (of both ions and electrons). The device changes its resistance based on ion concentration in the two metastable layers. When a voltage sufficient to overcome a charge-transfer threshold is applied, ions move across the barrier layer, thereby changing the resistive state of the device. When a voltage below the threshold is applied, the resistance can be read by the current that results while the resistive state of the device remains unchanged. Read/write operations may also be performed via application of electrical current pulses.

In neural network applications it is useful for a weight device to provide analog modulation between resistance states, where a voltage or current pulse is applied to change the resistance in a continuous or multi-stage fashion. In some embodiments, as many as a thousand different resistance states could be provided. Bidirectional, symmetric modulation is also important, where a voltage pulse in a first direction (e.g., positive) moves the resistance in a first direction (e.g., an increase) and a voltage pulse in a second direction (e.g., negative) moves the resistance in the opposite direction (e.g., a decrease). Furthermore, to be symmetric, a same number of positive and negative pulses will return the device to its original state-metastable materials provide a flat chemical potential across a compositional range, allowing for reversible modulation of ions. The per-pulse change in resistance need not be linear as long as the change up and down are predictable and symmetric. While the present embodiments are described with specific reference to neural network applications, it should be understood that the present embodiments may be employed in any contest where a settable resistance is needed.

Figure 1:
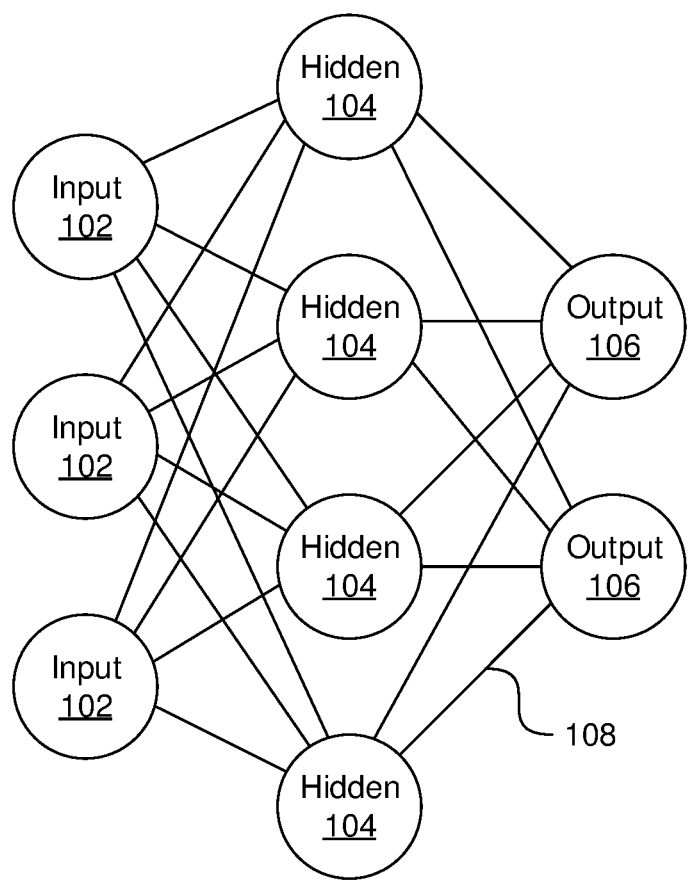
FIG. 1 is a diagram of a neural network.
Figure 2:
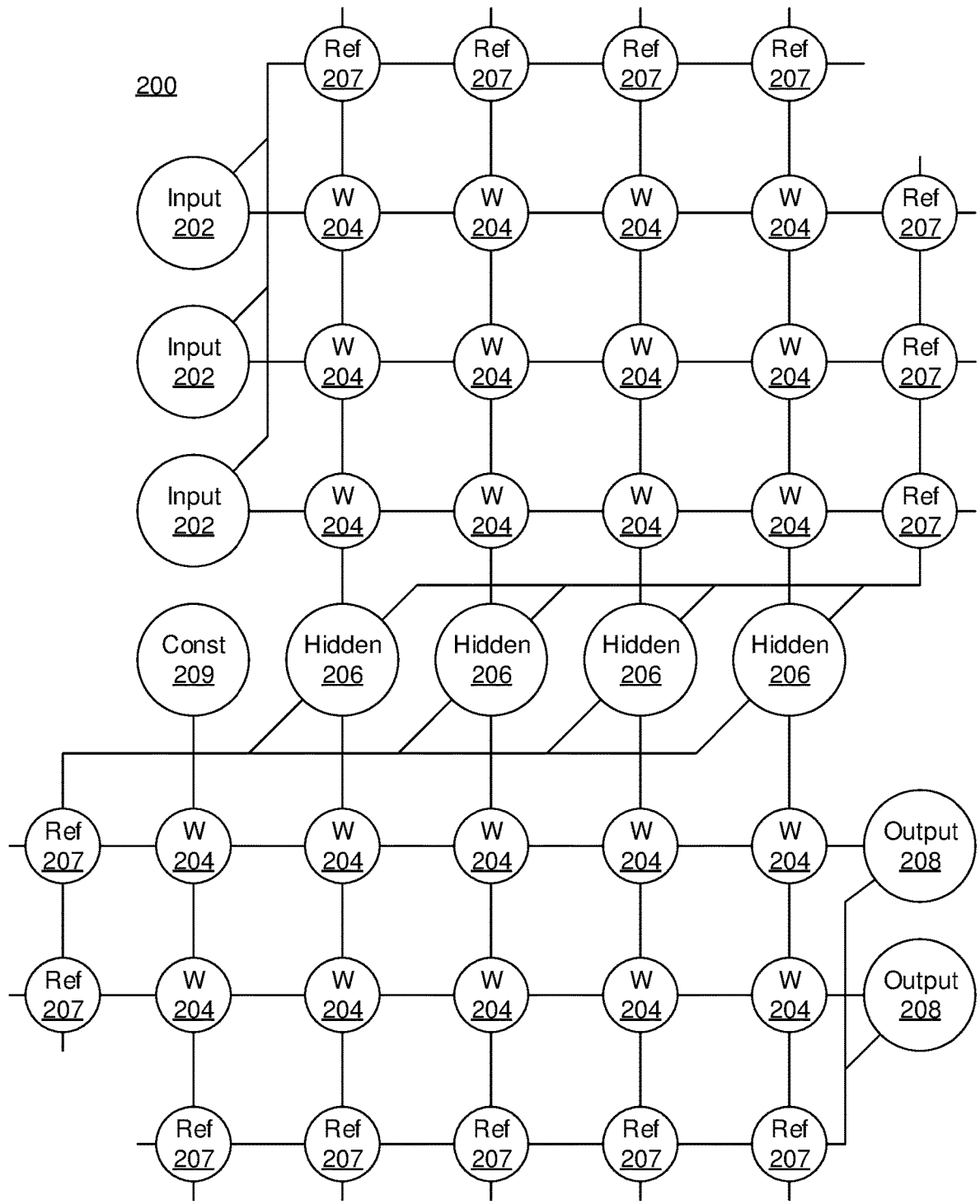
FIG. 2 is a diagram of a neural network that employs metastable, mixed-conductor memristive weights in accordance with an embodiment of the present invention.

Referring now to the drawings in which like numerals represent the same or similar elements and initially to FIG. 2, an artificial neural network (ANN) architecture 200 is shown. It should be understood that the present architecture is purely exemplary and that other architectures or types of neural network may be used instead. During feed-forward operation, a set of input neurons 202 each provide an input voltage in parallel to a respective row of weights 204. The weights 204 each have a settable resistance value, such that a current output flows from the weight 204 to a respective hidden neuron 206 to represent the weighted input. The current output by a given weight is determined as $$I = \frac{V}{r},$$

where V is the input voltage from the input neuron 202 and r is the set resistance of the weight 204. The current from each weight adds column-wise and flows to a hidden neuron 206. A set of reference weights 207 have a fixed resistance and combine their outputs into a reference current that is provided to each of the hidden neurons 206. Because conductance values can only be positive numbers, some reference conductance is needed to encode both positive and negative values in the matrix. The currents produced by the weights 204 are continuously valued and positive, and therefore the reference weights 207 are used to provide a reference current, above which currents are considered to have positive values and below which currents are considered to have negative values.

As an alternative to using the reference weights 207, another embodiment may use separate arrays of weights 204 to capture negative values. Each approach has advantages and disadvantages. Using the reference weights 207 is more efficient in chip area, but reference values need to be matched closely to one another. In contrast, the use of a separate array for negative values does not involve close matching as each value has a pair of weights to compare against. However, the negative weight matrix approach uses roughly twice the chip area as compared to the single reference weight column. In addition, the reference weight column generates a current that needs to be copied to each neuron for comparison, whereas a negative matrix array provides a reference value directly for each neuron. In the negative array embodiment, the weights 204 of both positive and negative arrays are updated, but this also increases signal-to-noise ratio as each weight value is a difference of two conductance values. The two embodiments provide identical functionality in encoding a negative value and those having ordinary skill in the art will be able to choose a suitable embodiment for the application at hand.

The hidden neurons 206 use the currents from the array of weights 204 and the reference weights 207 to perform some calculation. The hidden neurons 206 then output a voltage of their own to another array of weights 207. This array performs in the same way, with a column of weights 204 receiving a voltage from their respective hidden neuron 206 to produce a weighted current output that adds row-wise and is provided to the output neuron 208.

It should be understood that any number of these stages may be implemented, by interposing additional layers of arrays and hidden neurons 206. It should also be noted that some neurons may be constant neurons 209, which provide a constant voltage to the array. The constant neurons 209 can be present among the input neurons 202 and/or hidden neurons 206 and are only used during feed-forward operation.

During back propagation, the output neurons 208 provide a voltage back across the array of weights 204. The output layer compares the generated network response to training data and computes an error. The error is applied to the array as a voltage pulse, where the height and/or duration of the pulse is modulated proportional to the error value. In this example, a row of weights 204 receives a voltage from a respective output neuron 208 in parallel and converts that voltage into a current which adds column-wise to provide an input to hidden neurons 206. The hidden neurons 206 combine the weighted feedback signal with a derivative of its feed-forward calculation and stores an error value before outputting a feedback signal voltage to its respective column of weights 204. This back propagation travels through the entire network 200 until all hidden neurons 206 and the input neurons 202 have stored an error value.

During weight updates, the input neurons 202 and hidden neurons 206 apply a first weight update voltage forward and the output neurons 208 and hidden neurons 206 apply a second weight update voltage backward through the network 200. The combinations of these voltages create a state change within each weight 204, causing the weight 204 to take on a new resistance value. In this manner the weights 204 can be trained to adapt the neural network 200 to errors in its processing. It should be noted that the three modes of operation, feed forward, back propagation, and weight update, do not overlap with one another.

In the present embodiments, the weights 204 may be memristive devices. As will be described in greater detail below, the weights 204 may be implemented as two-terminal devices, where a low voltage provides a current output that reads the state of the weight 204 and an above-threshold voltage changes the state of the weight 204.

Figure 3:
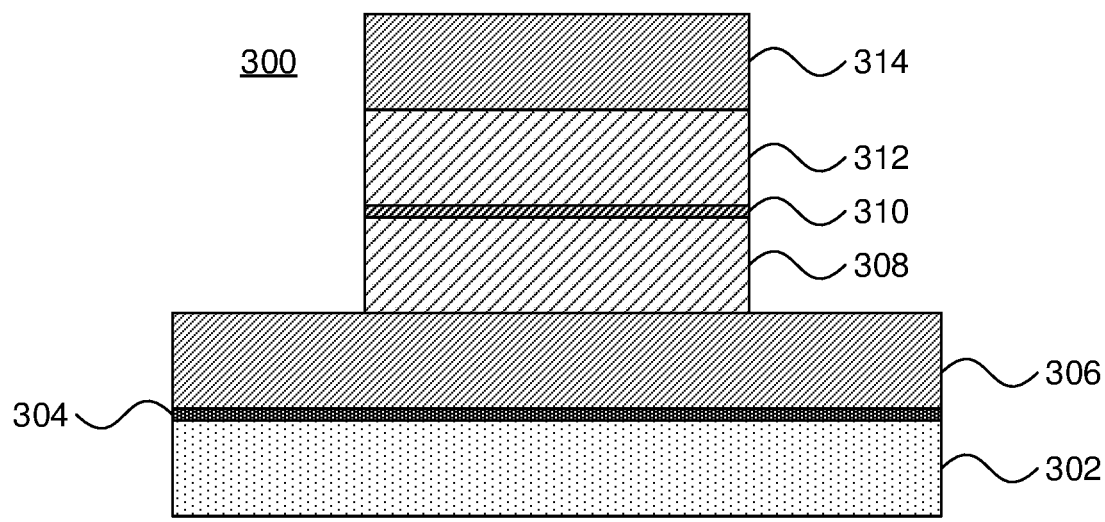
FIG. 3 is a cross-sectional diagram of a metastable, mixed-conductor memristive device in accordance with an embodiment of the present invention.

Referring now to FIG. 3, a detailed view of a first embodiment of a memristive device is shown. It is specifically contemplated that the memristive device 300 can be used to implement a weight 204 in an ANN, but the memristive device 300 is not limited to such embodiments. A stack of layers is formed on a substrate 102 with a binding layer 304 and a first electrode 306 therebetween. A first phase-separated, metastable, mixed ionic-electronic conductor layer 308 is formed on the first electrode 306. A mixed conducting barrier layer 310 is formed on the first conductor layer 306. A second phase-separated, mixed ionic-electronic conductor layer 312 is formed on the barrier layer.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate. In alternative embodiments, the substrate 102 may be formed from non-semiconductor materials such as, e.g., silicon dioxide or glass.

The binding layer 304 is formed from an appropriate material such as, e.g., chromium or titanium, to provide adhesion between the substrate 102 and the first electrode 306. An optional diffusion barrier (not shown) may be formed on the substrate prior to the formation of the binding layer 304 from, e.g., titanium nitride, silicon dioxide, aluminum oxide, or some combination of these materials. The first electrode may be formed from any appropriate inert metal such as, e.g., gold or platinum. In embodiments that employ lithium cobalt oxides in the conductor layers 308 and 312, it is specifically contemplated that the first electrode 306 may be formed from platinum to reduce the temperature needed to form the first conductor layer 308.

The first conductor layer 308 is formed from a material that changes its resistance based on ion concentration and is a conductor of both ions and electrons (referred to herein as a "mixed ionic electronic conductor"). It is specifically contemplated that the first conductor layer 308 will be formed from a metastable, phase separated material that maintains a constant potential for the ion charge carriers. Examples of metastable mixed ionic-electronic conductor (MIEC) materials include partially doped $Li_4Ti_5Co_{12}$—$Li_7Ti_5O_{12}$, high-temperature $Li_{0.95}CoO_2$—$Li_{0.75}CoO_2$, anatase $TiO_2$—$Li_{0.5}TiO_2$, $Li_xNbO_3$, and $SmNiO_3$—$Li_xSmNiO_3$ where each material is listed with a range of intercalated lithium concentrations.

The material for the first conductor layer 308 changes its resistance with the addition or removal of ions. In some materials, this change occurs due to the introduction or removal of charge carriers. In other materials, the change occurs due to an electronic transition, e.g. Mott transition.

The material for the first conductor layer 308 is metastable and separates into distinct phases based on ion concentration. In such a material, distinct sub-layers are formed within the first MIEC layer 308 with different ion concentrations, one layer being electrically conductive and the other layer being electrically insulating, and the relative sizes of the two sub-layers determines the resistance of the first conductor layer 308.

The first conductor layer 308 may have an exemplary thickness between about 50 nm and about 1,000 nm. The lower limit of 50 nm arises due to coherency strain, as it is the point where the materials lose their metastable, phase separated properties and become solid solutions, breaking symmetry by having a changing chemical potential for lithium ions.

The barrier layer 310 is formed from a material that has a high chemical potential relative to the material of the first conductor layer 308 and is a mixed ionic electronic conductor. Examples of such materials include anodic calcium-doped or manganese-doped $Li_4Ti_5O_{12}$, graphite, and graphene. Doped $Li_4Ti_5O_{12}$ is specifically contemplated for conductor layers of high-temperature $Li_xCoO_2$, where dopants may include any dopant that will prevent the barrier layer 310 from resistively switching upon device operation. Other dopant examples include alkaline metals (e.g., calcium), transition metals (e.g., tungsten, molybdenum, manganese, etc.), and lanthanide metals (e.g., lanthanum), as long as the material is more electrically conducting than that of the conductor layers 308 and 312. The barrier layer 310 may be kept thin, with a maximum thickness of about 200 nm, to inhibit retention of ions within the barrier layer 310. Ions retained in the barrier layer 310 can lead to a different resistance reading across the device. Instead, ions should be in either conductor layer 308 or 312, not in the barrier layer 308, to reduce deviations in read resistance. The barrier layer 310 should also be thick enough to prevent thermal diffusion, though this thickness will be material-dependent.

A second conductor layer 312 may be formed from the same material as the first conductor layer 308, but with a different ion concentration. The second conductor layer 312 may have a different thickness from the first conductor layer 308 to prevent zero resistance modulation. The initial ion concentrations of the first conductor layer 308 and the second conductor layer 312 are tuned to ensure that both layers are metastable. For example, in the case of conductor layers formed from $Li_xCoO_{12}$, chemical or electrical delithiation may be used to set the lithium ion concentration of the second conductor layer 312 during processing.

A chemical potential relationship between the first conductor layer 308, the barrier layer 310, and the second conductor layer 312 provides a chemical potential for the barrier layer 310 that is significantly higher than the chemical potential of the first conductor layer 308 and the second conductor layer 312. This higher chemical potential prevents the thermal diffusion of ions from one conductor layer to the other, while providing operational transfer of ions when a sufficiently high voltage is applied (e.g., a voltage that provides the ions with enough energy to overcome the chemical potential). In one example, where the first conductor layer 308 and the second conductor layer 312 are formed from $Li_xCoO_2$ and the barrier layer 310 is formed from manganese-doped $Li_4Ti_5O_{12}$, the threshold voltage needed to overcome the potential barrier is about 2.3V. In another example, where the first conductor layer 308 and the second conductor layer 312 are formed from $Li_xCoO_2$ and the barrier layer 310 is formed from graphene, the threshold voltage needed to overcome the potential barrier is about 3V.

A second electrode layer 314 is formed on the second conductor layer 312 and may be formed from the same material as the first electrode layer 306 or a different material. Thus the second electrode layer 314 may be formed from, e.g., gold or platinum or any other appropriately conducting metal.

The composition of the conductor layers 308 and 312 governs the resistive characteristics of the device. For example, the material $Li_xCoO_x$ is relatively conductive below x=0.75 and becomes relatively insulating at lithium concentrations above x=0.93. Thus, by controlling the lithium concentration in the conductor layers 308 and 312 (with one of the two layers acting as a reservoir for lithium ions), the resistance of the device 300 can be closely controlled.

In the specific embodiments discussed herein, the Mott transition refers to an electrical metal-to-nonmetal transition, where the material's conductivity abruptly changes based on electric field screening from intercalated ions in a conductor layer (e.g., layer 308 or 312). When the concentration is above or below the Mott transition point, the resistivity remains substantially constant-being relatively insulating or relatively conducting. A Mott transitioning material may also be metastable, wherein the Mott transition points may lie at the concentrations on the edge of a miscibility gap defined by the stability of the material (e.g., below x=0.75 or above x=0.93 for $Li_xCoO_x$). A metastable Mott transitioning material has two different sublayers formed in each of the conductor layers-one which has a lithium concentration at or below the lower Mott transition point and one which has a lithium concentration at or above the upper Mott transition point.

The layers of the memristive device 300 may be formed by any appropriate process. For example, the layers may be formed by processes including, e.g., chemical vapor deposition (CVD), physical vapor deposition (PVD), atomic layer deposition (ALD), pulsed laser deposition (PLD), sol-gel deposition, or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition. In alternative embodiments, the layers may be deposited with a sol-gel process, whereby a colloidal solution of monomers is used to lay out an integrated network of material.

After formation of the stack of layers, a single memristive device 300 can be etched out using an anisotropic etch such as reactive ion etching (RIE). RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

During operation of the memristive device 300, an electric voltage pulse is applied to the device to transfer interstitial ions between the first conductor layer 306 and the second conductor layer 312. In this embodiment, phase separation keeps a constant chemical potential for lithium, providing reversible lithium insertion. Depending on the materials used, the relative concentration of ions in the first conductor layer 308 and second conductor layer 312 controls the read resistance of the device 300. By using the same material for the first conductor layer 308 and the second conductor layer 312, a zero built-in voltage can be achieved.

Due to the charge transfer kinetics of the heterojunction at the interface with the barrier layer 310, low applied voltages will not significantly affect the ion concentration. This provides the threshold between read and write operations for the device 300. The higher chemical potential of the barrier layer 310 provides a thermodynamic barrier to transferring ions between the first conductor layer 308 and the second conductor layer 312 when no voltage is applied, thereby providing non-volatility.

In one specific example, the device 300 may be fabricated using a sol-gel process with alkoxides to deposit the layers on the first electrode 306. In this example, the first electrode 306 is formed from platinum, and the first conductor layer 308 is formed on the platinum layer using lithium ethoxide (1.5:1) dissolved in 5 w %/v cobalt (II) 2-methoxyethoxide in 2-methoxyethanol, cast at about 1000 RPM and soft-baked for about one minute at about 300° C. The barrier layer 310 is formed on the first conductor layer 308 using lithium acetate, titanium isopropoxide, acetic acid, and water cast at about 6000 RPM and soft-baked for about one minute at about 300° C. The second conductor layer 312 is formed on the barrier layer 310 using lithium ethoxide with cobalt (II) 2-methoxyethoxide, 99% in methoxyethanol, with the addition of manganese acetylacetonate, cast at about 1000 RPM and soft-baked for about one minute at about 300° C. The entire stack is then baked for about an hour at about 500° C.

The addition of manganese tunes the base resistance of the device and, in the case of a $Li_xTiO_2$ barrier layer 310, makes the barrier layer 310 conductive. The manganese diffuses through the stack, with an exemplary final concentration of about 5% manganese throughout.

The particular embodiment described herein is for a memristive device 300 in an ANN. In one specific arrangement, the electrodes 306 and 314 represent cross-bar electrodes in ANN 200, with a first electrode 306 providing column addressability and the second electrode 314 providing row addressability. In such an arrangement, voltages may be applied on each electrode to move lithium ions in the device 300 and thus change the resistance. Each electrode may therefore carry a voltage that is less than the threshold voltage (e.g., one carrying a small positive voltage and the other carrying a small negative voltage), and when a device 300 has both electrodes energized, the summed voltage exceeds the threshold voltage. Thus a specific weight 204 in an array can be written to.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 4:
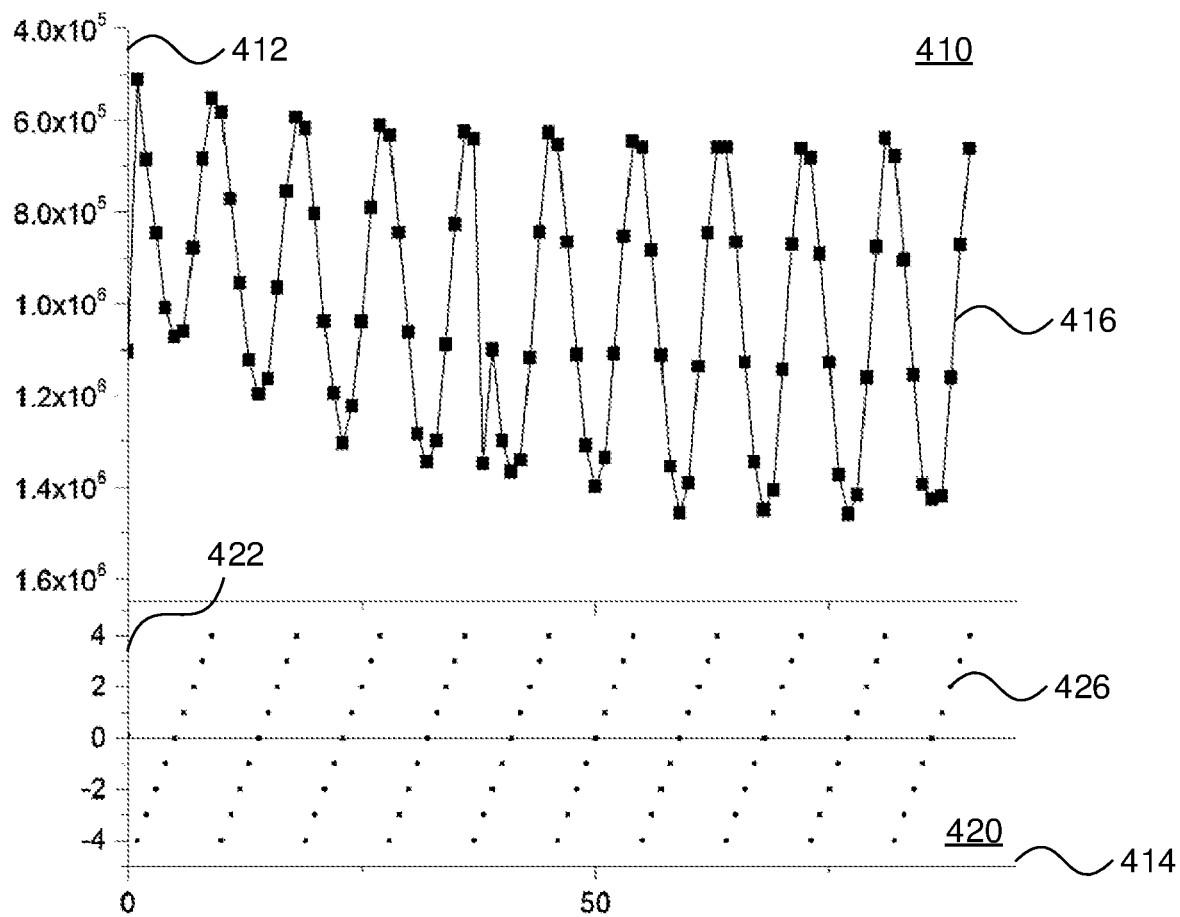
FIG. 4 is a set of graphs illustrating the resistance state of a metastable, mixed-conductor memristive device under cyclical voltage inputs in accordance with an embodiment of the present invention.

Referring now to FIG. 4, results for the above-described example of a device 300 are shown. The first graph 410 has a vertical axis 412 that plots resistance in ohms and a horizontal axis 414 that plots a number of pulses. The pulses are applied in a pattern of −4V, −3V, −2V, −1V, 0V, 1V, 2V, 3V, 4V with the pattern repeating five times, each repetition showing a peak on the plotted data 416. As can be seen, the pattern is stable and roughly symmetric over the course of a single cycle. After each pulse, the resistance was read that the below-threshold voltage of about 0.1V to determine the resistance of the device 300. The second graph 420 plots applied voltage on its vertical axis 422, and uses the same horizontal axis 414 to show pulse number. The cyclic applied voltages shown as points 426 correspond to the cyclic, symmetric changes in resistance.

Figure 9:
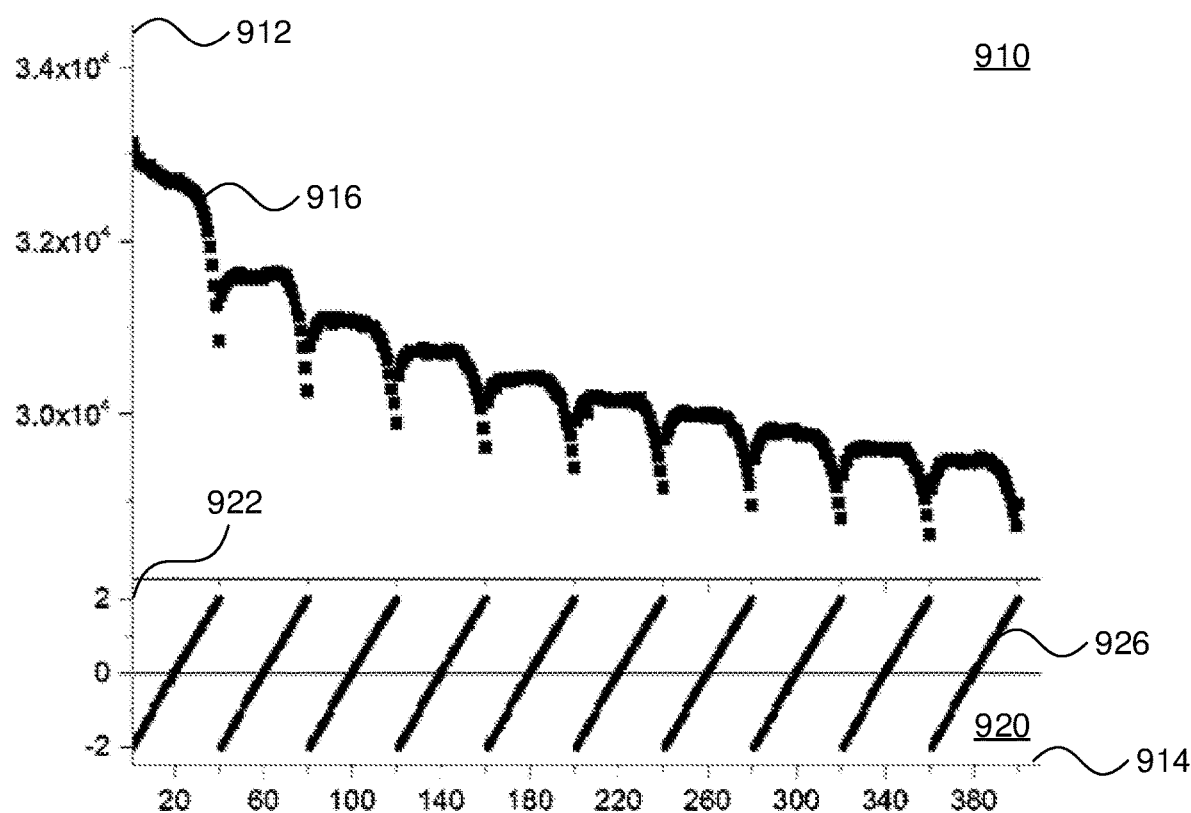
FIG. 9 is a graph illustrating the resistance state of a graphene-based memristive device under cyclical voltage inputs in accordance with an embodiment of the present invention.

Referring now to FIG. 9, results are shown that illustrates resistance in an alternative embodiment that uses a graphene material for the barrier layer 310. A first graph 910 has a vertical axis that plots resistance in ohms and a horizontal axis 914 that plots a number of voltage pulses. The pulses range in voltage from −2 to 2 and have a step size of about 0.1V. The pulses are cycled through ten times, with each repetition corresponding to a repetition of the pattern of resistance values 916. Reads are performed at 0.1V.

The second graph 920 plots the applied voltage 926 in volts on its vertical axis 922 using the same horizontal axis 914 to show pulse number. The cyclic applied voltages shown as points 926 correspond to cyclic, symmetric changes in the resistance values 916. As can be seen, the pattern stabilizes and is roughly symmetric over the course of a single cycle. The relatively flat plateaus of the resistance values 916 correspond to below-threshold applied voltages, resulting in little or no change to the resistance value in these regions.

Figure 5:
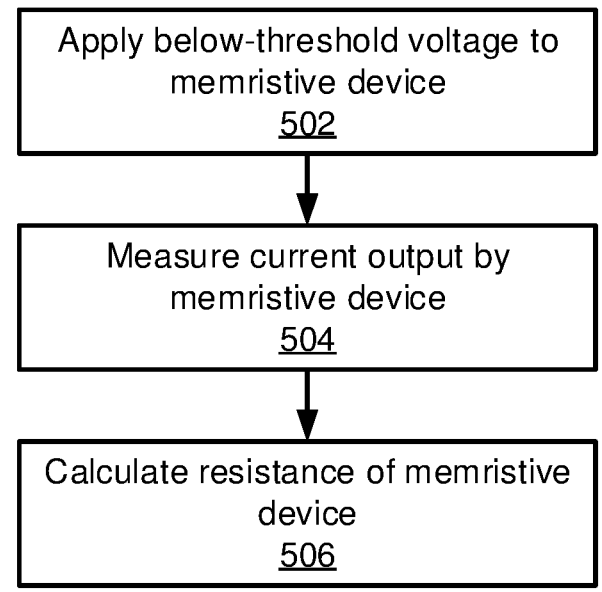
FIG. 5 is a block/flow diagram of a method for reading the resistance of a metastable, mixed-conductor memristive device in accordance with an embodiment of the present invention.

Referring now to FIG. 5, a method for reading a resistance value of a memristive device 300 is shown. Block 502 applies a below-threshold voltage across the electrodes 306 and 314 of the memristive device 300. This voltage creates a current through the layers, which block 504 measures. Block 506 then calculates the resistance of the memristive device 300 by Ohm's law, which is expressed as R=I/V, where V is the applied voltage, R is the resistance of the device, and/is the measured current. It should be understood that this process represents only one way to determine the resistance of a memristive device 300 and that any other appropriate process for determining the resistance of the device may be applied instead.

Figure 6:
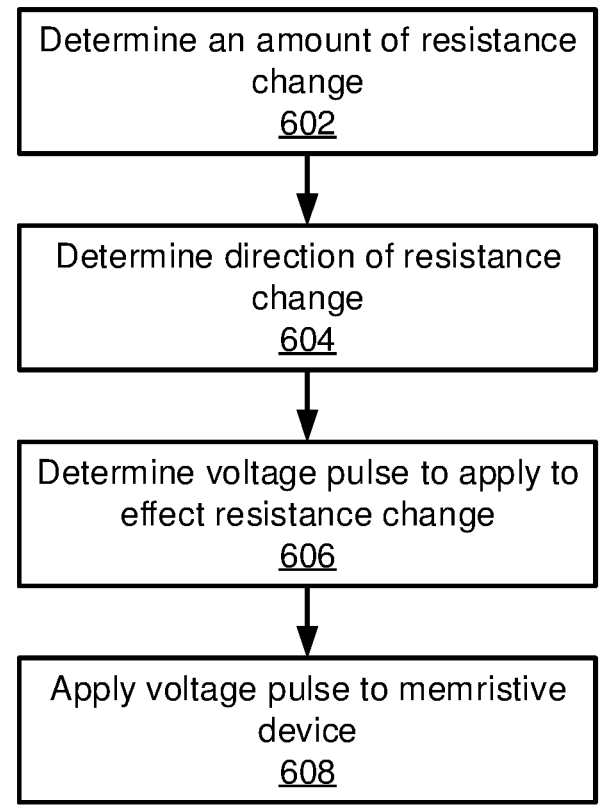
FIG. 6 is a block/flow diagram of a method for changing the resistance of a metastable, mixed-conductor memristive device in accordance with an embodiment of the present invention.

Referring now to FIG. 6, a method for changing a resistance value of a memristive device 300 is shown. Block 602 determines an amount of resistance change that is needed, while block 604 determines a direction of resistance change that is needed. This may be performed, for example, as part of a backpropagation process within an ANN. For example, it may be determined that the resistance of a particular weight 204 should be increased or decreased by a certain amount. Block 606 then determines the magnitude of a voltage pulse that corresponds to the determined change and block 608 applies the voltage pulse to the memristive device 300 across the electrodes 306 and 314.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 7:
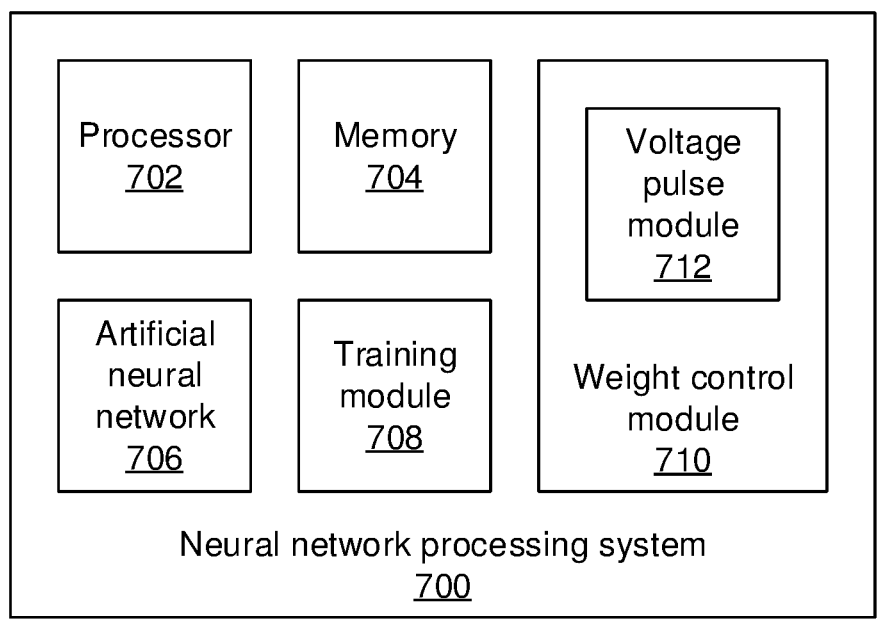
FIG. 7 is a block diagram of a neural network processing system in accordance with an embodiment of the present invention.

Referring now to FIG. 7, a neural network processing system 700 is shown. The system 700 includes a hardware processor and memory 704. An ANN 706 is implemented in the system 700 using hardware weights 204 formed from memristive devices 300. The ANN 706 may further include hardware and/or software components to handle neuron calculations and backpropagation operations. In addition the system 700 includes one or more functional modules that are, in some embodiments, implemented as software that is stored in the memory 704 and executed by the hardware processor 702. In alternative embodiments, the functional modules may be implemented as one or more discrete hardware components in the form of, e.g., application-specific integrated chips or field programmable gate arrays.

A training module 708 trains the ANN 706 using, for example, a set of training data. The ANN 706 is used to generate a prediction and, if the prediction does not closely match the training data, alterations are made to the weights 204 to bring the ANN 706 toward a matching state. To accomplish this, the training module 708 uses weight control module 710 to change the values of the weights 204.

In the context of the present embodiments, where the values of the weights 204 are encoded as electrical resistance values, the weight control module 710 calculates an amount of resistance change needed and an appropriate voltage pulse to effect that resistance change. A voltage pulse module 712 then applies the determined voltage pulse to one or more weights 204 in the ANN 706. The training process may be repeated many times, until the training module 708 determines that the output of the ANN 706 is within some threshold of the expected outcome determined by the training data.

Figure 8:
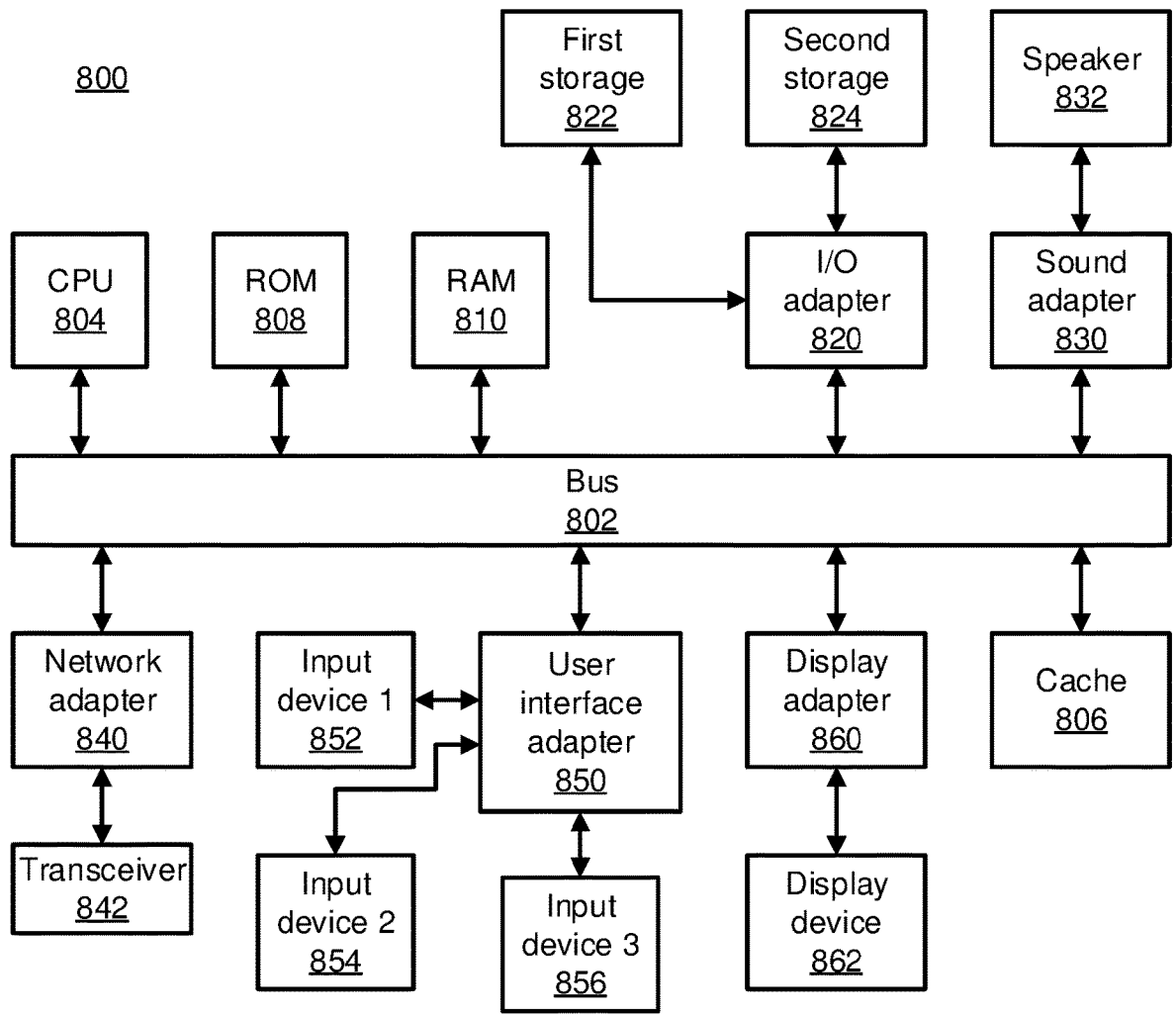
FIG. 8 is a block diagram of a processing system in accordance with an embodiment of the present invention.

Referring now to FIG. 8, an exemplary processing system 800 is shown which may represent the neural network processing system 700. The processing system 800 includes at least one processor (CPU) 804 operatively coupled to other components via a system bus 802. A cache 806, a Read Only Memory (ROM) 808, a Random Access Memory (RAM) 810, an input/output (I/O) adapter 820, a sound adapter 830, a network adapter 840, a user interface adapter 850, and a display adapter 860, are operatively coupled to the system bus 802.

A first storage device 822 and a second storage device 824 are operatively coupled to system bus 802 by the I/O adapter 820. The storage devices 822 and 824 can be any of a disk storage device (e.g., a magnetic or optical disk storage device), a solid state magnetic device, and so forth. The storage devices 822 and 824 can be the same type of storage device or different types of storage devices.

A speaker 832 is operatively coupled to system bus 802 by the sound adapter 830. A transceiver 842 is operatively coupled to system bus 802 by network adapter 840. A display device 862 is operatively coupled to system bus 802 by display adapter 860.

A first user input device 852, a second user input device 854, and a third user input device 856 are operatively coupled to system bus 802 by user interface adapter 850. The user input devices 852, 854, and 856 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 852, 854, and 856 can be the same type of user input device or different types of user input devices. The user input devices 852, 854, and 856 are used to input and output information to and from system 800.

Of course, the processing system 800 may also include other elements (not shown), as readily contemplated by one of skill in the art, as well as omit certain elements. For example, various other input devices and/or output devices can be included in processing system 800, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 800 are readily contemplated by one of ordinary skill in the art given the teachings of the present principles provided herein.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for setting a resistance, comprising:
applying a voltage across a memristive device, that exceeds a threshold based on a difference in chemical potential between a first material and a second material, to change a resistance of the memristive device, wherein the memristive device includes a barrier layer of the second material that is formed between two metastable layers of the first material, wherein each metastable layer comprises a conductive portion with a first lithium ion concentration and an insulator portion with a second lithium ion concentration.

2. The method of claim 1, wherein applying the voltage comprises applying a positive voltage at a first terminal of the memristive device and applying a negative voltage at a second terminal of the memristive device at a same time.

3. The method of claim 2, wherein the positive voltage and the negative voltage are each separately below the threshold.

4. The method of claim 1, further comprising cycling positive and negative voltages that exceed the threshold until a resistance symmetric response stabilizes.

5. The method of claim 1, wherein the first material comprises $Li_xCoO_2$, wherein the variable x represents a lithium ion concentration, and wherein one of the two metastable layers of the first material has a conductive portion with a lithium ion concentration of x<0.75 and an insulator portion with a lithium concentration of x>0.93.

6. The method of claim 5, wherein the second material comprises $Li_4Ti_5O_{12}$.

7. The method of claim 6, wherein the barrier layer of the second material and the two metastable layers each comprise a manganese dopant.

8. The method of claim 1, wherein the second material comprises a material selected from the group consisting of graphene and graphite.

9. The method of claim 1, wherein the first material is $Li_xTi_5O_{12}$, where the variable x represents a lithium ion concentration.

10. The method of claim 9, wherein the second material is selected from a group consisting of graphene and graphite.

11. The method of claim 9, wherein the first material is partially doped with a dopant selected from a group consisting of alkaline metals, transition metals, and lanthanide metals.

12. The method of claim 1, wherein applying the voltage across the memristive device causes ions to move from a first metastable layer of the two metastable layers to a second metastable layer of the two metastable layers, changing ion concentrations in each metastable layer.

13. The method of claim 12, wherein a resistance of each metastable layer is a sum of the resistance of the conductive portion and the insulator portion.

14. A method for setting a resistance, comprising:
applying a voltage across a memristive device, that exceeds a threshold based on a difference in chemical potential between a first material and a second material, to change a resistance of the memristive device, wherein the memristive device includes a barrier layer of the second material that is formed between two metastable layers of the first material;
cycling positive and negative voltages that exceed the threshold;
halting the cycling of positive and negative voltages responsive to a determination that a resistance symmetric response has stabilized.

15. The method of claim 14, wherein each metastable layer comprises a conductive portion with a first lithium ion concentration and an insulator portion with a second lithium ion concentration.

16. The method of claim 15, wherein applying the voltage across the memristive device causes ions to move from a first metastable layer of the two metastable layers to a second metastable layer of the two metastable layers, changing ion concentrations in each metastable layer.

17. The method of claim 15, wherein a resistance of each metastable layer is a sum of the resistance of the conductive portion and the insulator portion.

18. A method for setting a resistance, comprising:
applying a voltage across a memristive device, that exceeds a threshold based on a difference in chemical potential between a first material that comprises a lithium cobalt oxide and a second material that comprises $Li_4Ti_5O_{12}$, to change a resistance of the memristive device, wherein the memristive device includes a barrier layer of the second material that is formed between two metastable layers of the first material;
cycling positive and negative voltages that exceed the threshold;
halting the cycling of positive and negative voltages responsive to a determination that the symmetric response has stabilized.

* * * * *